United States Patent
Ayyapureddi et al.

(10) Patent No.: US 7,046,560 B2
(45) Date of Patent: May 16, 2006

(54) REDUCTION OF FUSIBLE LINKS AND ASSOCIATED CIRCUITRY ON MEMORY DIES

(75) Inventors: Sujeet V. Ayyapureddi, Boise, ID (US); Vasu Seeram, Colorado Springs, CO (US)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 10/932,707

(22) Filed: Sep. 2, 2004

(65) Prior Publication Data

US 2006/0056243 A1    Mar. 16, 2006

(51) Int. Cl.
*G11C 29/00* (2006.01)
*G06F 11/00* (2006.01)
*G06F 12/00* (2006.01)

(52) U.S. Cl. ............ 365/200; 365/230.01; 365/230.03; 365/244; 711/200; 711/202; 714/17; 714/38; 714/757; 714/766

(58) Field of Classification Search ................ 365/200, 365/230.01; 711/200; 714/17, 38
See application file for complete search history.

(56) References Cited

U.S. PATENT DOCUMENTS

| | | | |
|---|---|---|---|
| 5,281,868 A | 1/1994 | Morgan et al. | 326/10 |
| 5,574,689 A | 11/1996 | Morgan et al. | 365/200 |
| 6,026,505 A * | 2/2000 | Hedberg et al. | 714/711 |
| 6,144,593 A | 11/2000 | Cowles et al. | 365/200 |
| 6,154,854 A * | 11/2000 | Stallmo | 714/6 |

OTHER PUBLICATIONS

U.S. Appl. No. 10/862,284, filed Jun. 7, 2004.

* cited by examiner

*Primary Examiner*—Amir Zarabian
*Assistant Examiner*—Ly Duy Pham
(74) *Attorney, Agent, or Firm*—Fish & Neave IP Group Ropes & Gray LLP

(57) ABSTRACT

The number of fusible links and other circuit components required to provide memory cell redundancy are reduced by sharing physical memory locations among address banks that store memory addresses. Non-trial and error algorithms and techniques determine the number of addresses and the number of identical least significant bit (LSB) values that can share the same physical memory location. By sharing physical locations for identical LSB values, circuit hardware on a memory device (including fusible links and compare circuitry) is reduced. Thus, less die area is needed to provide the same degree of redundancy.

6 Claims, 21 Drawing Sheets

FIG. 6A

| N | $2^L$ | K[L] |
|---|---|---|
| 16 | 8 | 2[3] |

K is less than $2^{L+1}$;
2 is less than $2^{3+1}$.
Therefore L value for next cycle is current L less 1.

FIG. 6B

| N | $2^L$ | K[L] |
|---|---|---|
| 16 | 8 | 2[3] |
| 14 | 4 | 3[2] |

K is less than $2^{L+1}$;
3 is less than $2^{2+1}$.
Therefore L value for next cycle is current L less 1.

FIG. 6C

| N | $2^L$ | K[L] |
|---|---|---|
| 16 | 8 | 2[3] |
| 14 | 4 | 3[2] |
| 11 | 2 | 5[1] |

K is not less than $2^{L+1}$;
5 is not less than $2^{1+1}$.
Therefore L value for next cycle is current L.

FIG. 6D

| N | $2^L$ | K[L] |
|---|---|---|
| 16 | 8 | 2[3] |
| 14 | 4 | 3[2] |
| 11 | 2 | 5[1] |
| 6 | 2 | 3[1] |

K is less than $2^{L+1}$;
3 is less than $2^{1+1}$.
Therefore L value for next cycle is current L less 1.

FIG. 6E

| N | $2^L$ | K[L] |
|---|---|---|
| 16 | 8 | 2[3] |
| 14 | 4 | 3[2] |
| 11 | 2 | 5[1] |
| 6 | 2 | 3[1] |
| 3 | 1 | 3[0] |

L is zero.

| 760 | 762 |
|---|---|
| 00000 | 1 |
| 10101 | 2 |
| 11101 | 2 |
| 11000 | 4 |
| 10110 | 4 |
| 10011 | 3 |
| 01000 | 1 |
| 00111 | 5 |
| 11111 | 3 |
| 11001 | 3 |
| 01111 | 3 |
| 00001 | 3 |
| 00010 | 4 |
| 10001 | 2 |
| 01010 | 5 |
| 01011 | 5 |

FIG. 7A

700
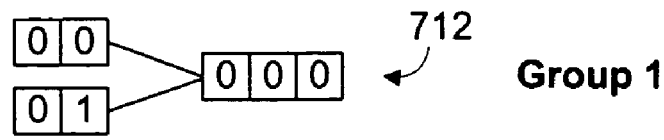
Group 1
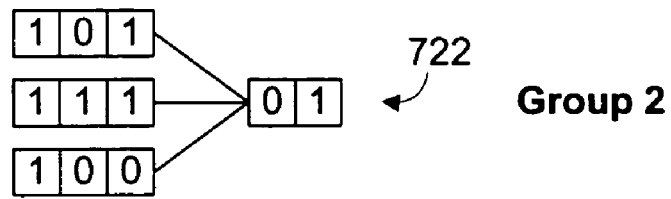
Group 2
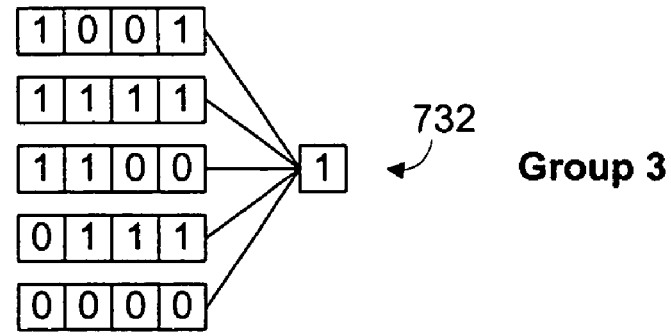
Group 3
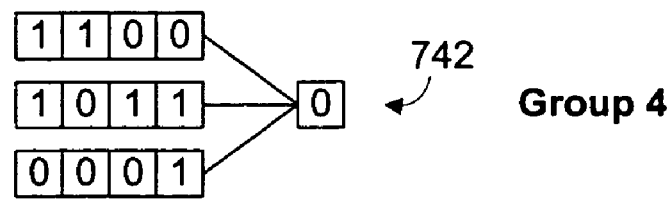
Group 4
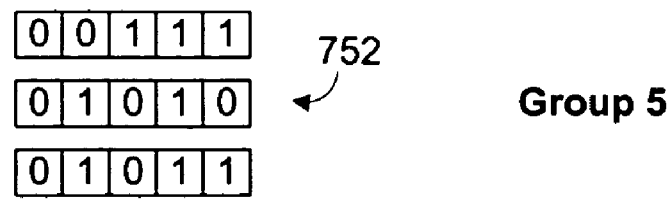
Group 5
FIG. 7B

860 — 862

| | |
|---|---|
| 11111 | 2 |
| 10011 | 2 |
| 11101 | 3 |
| 10010 | 5 |
| 01011 | 3 |
| 00011 | 2 |
| 11000 | 1 |
| 10011 | 3 |
| 01100 | 5 |
| 01000 | 1 |
| 10111 | 3 |
| 10101 | 3 |
| 11011 | 5 |
| 11010 | 4 |
| 00100 | 4 |
| 10000 | 4 |

FIG. 8A

| N | $2^L$ | K[L] | (K-1)x(L) |
|---|---|---|---|
| 16 | 8 | 2[3] | 3 |
| 14 | 4 | 3[2] | 4 |
| 11 | 2 | 5[1] | 4 |
| 6 | 2 | 3[1] | 2 |
| 3 | 1 | 3[0] | 0 |
| | | | 13 |

| N | $2^L$ | K[L] |
|---|---|---|
| 16 | 4 | 4[2] |
| 12 | 4 | 3[2] |
| 9 | 4 | 2[2] |
| 7 | 2 | 3[1] |
| 4 | 2 | 2[1] |
| 2 | 1 | 2[0] |

FIG. 11

| N | [L] |
|---|---|
| 19 | 2[4] |
| 17 | 2[4] |
| 15 | 2[3] |
| 13 | 2[3] |
| 11 | 2[3] |
| 9 | 2[3] |
| 7 | 2[2] |
| 5 | 2[2] |
| 3 | 2[1] |
| 1 | 1[0] |

FIG. 14

REDUCTION OF FUSIBLE LINKS AND ASSOCIATED CIRCUITRY ON MEMORY DIES

BACKGROUND OF THE INVENTION

This invention relates to memory devices. More particularly, this invention relates to memory devices that use fewer circuit components for the same memory capacity while maintaining the same memory redundancy.

Many approaches have been used to increase memory density on dies. A die is a single piece of silicon (or other semiconductor) on which integrated circuits are fabricated. Memory density is the number of bits that can be stored in memory on a die. One way to increase memory density is to make the memory devices smaller. Another way is to reduce the number of circuit components required to implement the same memory capacity. For example, if one hundred circuit components can be interconnected to provide the same memory capacity as one hundred and fifty similarly sized circuit components, memory density is increased (because less area on the die is used, which allows for more memory capacity).

Memory devices are typically implemented on a die as a plurality of redundancy structures and memory cells. Memory cells store data, and redundancy structures store addresses for memory cells. Those structures may be used if any of those cells are identified as being damaged by pre-ship testing. Memory cells are typically arranged on a memory device as an array of rows and columns (primary rows and columsn). Each intersection of a row and a column has an address. An external device such as a microprocessor uses an address of a memory cell (stored in a redundancy structure) to access the content of that memory cell.

Memory devices are tested for damaged rows and columns prior to shipping to a customer. Memory devices have several spare (redundant) rows and columns. If a portion of a primary row or column is damaged, a redundant row or column can be used to replace the damaged row or column. This is known as "repairing." When a redundant row or column is used, the memory device is "programmed" to access a redundant memory cell of that row or column instead of the primary cell of the damaged row or column.

One way to program which memory cells are accessed is by using fusible links. Fusible links (hereinafter "fuses") are integrated circuit components that are designed to break (or burn) when a relatively high current is selectively applied. This severs the connection between two points. Alternatively, "anti- fuses" are designed to connect two points. Memory cell programming usually occurs before the memory device is shipped to a customer.

A test circuit determines which memory cells, if any, are damaged. The addresses of damaged memory cells are programmed into "fuse banks" on the redundancy structure. If an address for a memory cell matches an address programmed into the fuse bank, logic is set up such that the access to the damaged cell is redirected to the replacement cell.

To provide full redundancy in a memory device using fuses, the number of fuses should equal the number of bits used to address the memory cell. Additionally, an equal number of XNOR gates are required. For example, if a seven-bit address is used to address a memory cell, then seven fuses and seven XNOR gates are required to provide full redundancy.

Fuses and XNOR gates consume large amounts of area on a die. Attempts have been made to reduce the number of fuses and XNOR gates on a die while maintaining substantially the same degree of memory redundancy. The success of these attempts has been limited, primarily because they have been based on trial and error.

In view of the foregoing, it would be desirable to be able to provide algorithms and other non-trial and error techniques that reduce the number of fuses and other circuit components (e.g., XNOR gates) on a memory die while maintaining the same memory redundancy.

SUMMARY OF THE INVENTION

It is an object of this invention to provide algorithms and other non-trial and error techniques that reduce the number of fuses and other circuit components on a memory die while maintaining the same memory redundancy.

In accordance with the invention, three approaches to reducing the number of fuses and associated circuit components are provided. Each of these approaches involve mathematical algorithms.

When storing multiple addresses on a redundancy structure, the same bit value for two or more addresses often occurs in the same bit position. For example, a logic value 1 may be the least significant bit (LSB) in two addresses (e.g., 00001 and 11111). For any random set of more than two five-bit addresses, the set will have a number of addresses that have three LSBs in common. The number of addresses that have three LSBs in common will be less than the number of addresses that have two LSBs in common. In turn, the number of addresses that have two LSBs in common will be less than the number of addresses that have one LSB in common. This can be extrapolated for a set of addresses of any bit length. For example, for a set of addresses having Y bits each, the number of addresses that share Y-1 LSBs will be less than the number of addresses that share Y-2 LSBs. The number of addresses that share Y-2 LSBs will be less than the number of addresses that share Y-3 LSBs, and so on.

For example, for a set of 32 addresses that are each five bits long, there will be at least 16 addresses (8 pairs of address banks) that share four LSBs, at least 8 addresses (4 pairs of address banks) that share three LSBs, at least 4 addresses (2 pairs of address banks) that share two LSBs, and at least 2 addresses (1 pair of address banks) that share one LSB.

By sharing LSBs, the number of fuses and circuit components required to store addresses can be reduced, while maintaining substantially the same redundancy (and ultimately usable capacity).

For a set of M addresses, the two mathematical algorithms determine (without trial and error) the number of address banks that can share LSBs and the number of LSBs that can be shared among those banks.

For example, to store a set of 16 addresses, the first algorithm determines that the redundancy structure has two banks that share three LSBS, another three banks that share two LSBs, five more banks that share one LSB, another three banks that share one LSB, and three residual banks that do not share any LSBS.

Using the second algorithm, the redundancy structure stores 16 addresses in four banks that share two LSBs, another three banks that share two LSBs, two more banks that share two LSBs, three more banks that share one LSB, another two banks that share one LSB, and two residual banks that share no LSBS.

The third algorithm, the binary approach, is based on the repetition of LSBs in binary numbers. For example, 0 to 15 in binary is represented as: 0000 (0), 0001 (1), 0010 (2), 0011 (3), 0100 (4), 0101 (5), 0110 (6), 0111 (7), 1000 (8), 1001 (9), 1010 (10), 1011 (11), 1100 (12), 1101 (13), 1110 (14), 1111 (15). As shown, the three LSBs of 0 and 8 are identical, as are the three LSBs of 1 and 9, 2 and 10, etc. In addition, the two LSBs of 0, 4, 8, and 12 are identical, as are the two LSBs of 1, 5, 9, and 13, as are the two LSBs of 2, 6, 10, and 14, etc. Using this symmetry, the fuses and circuitry associated with seventeen bits of binary addresses 0000 to 1111 can be saved when a redundancy structure is constructed to store sixteen addresses in accordance with the invention.

The sharing of LSBs using any of the three approaches systematically reduces the number of circuit components in a memory device for the same memory capacity.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIGS. 6A–6E illustrate the cyclic results of the algorithm of FIG. 3 using the application of FIG. 4;

FIG. 7A shows a random pattern of 16 addresses and corresponding group numbers;

FIG. 7B represents physical storage for the 16 random addresses of FIG. 7A;

FIG. 8A shows another random pattern of 16 addresses and corresponding group numbers;

FIG. 9B is a table showing the number of bits saved by cycle using the first algorithm when M is equal to 16;

- FIG. 11 illustrates the cyclic results of the algorithm of FIG. 10 using M equal to 16;

FIG. 14 is an illustration of the cyclic results of the algorithm of FIG. 13 using M equal to 19;

DETAILED DESCRIPTION OF THE INVENTION

The invention provides several non-trial and error approaches for determining the number of address banks that can share least significant bits (LSBs) and the number of LSBs that can be shared among those banks. This systematically-determined sharing results in less circuit area being used to implement the same amount of memory redundancy as compared to a memory device without such sharing. Memory devices constructed in accordance with the invention will advantageously use less circuitry to provide the same redundancy (repairability) as conventional memory devices.

Figure 1A:
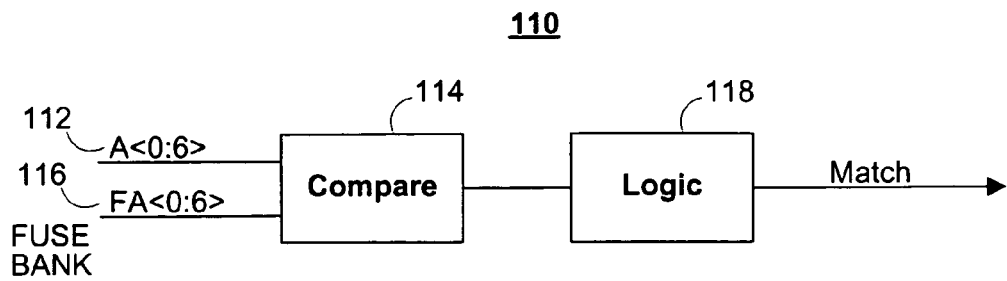
FIG. 1A illustrates hardware components for identifying a seven-bit address of a damaged memory cell.

A conventional approach to programming fuses to access redundant memory cells is now described in connection with FIG. 1A. Circuit 110 identifies fuses of defective memory cells by comparing memory cell addresses with addresses of fuse banks. A seven-bit address 112 (denoted "A<0:6>") of a defective memory cell is compared by compare circuitry 114 to seven-bit addresses 116 (denoted "FA<0:6>") of various fuse banks. A fuse bank is essentially a collection of fuses.

Compare circuit 114 compares each bit of the seven-bit address 112 with each bit of a fuse bank address 116. Compare circuit 114 typically includes one XNOR gate for each bit compared. In this case, compare circuit 114 includes seven XNOR gates. If a bit of address 112 has the same value as a bit in the same bit position of address 116, the XNOR gate for that comparison will output a logic one value. This is done for each bit of address 112.

The output of each XNOR gate in compare circuit 114 is provided to logic circuit 118. Logic circuit 118 typically includes AND gates. If the output of each XNOR gate of compare circuit 114 is a logic one value, then address 112 and address 116 are the same and the output of logic circuit 118 is a logic one, indicating matching addresses. Matching addresses indicate that fuses of the corresponding defective memory cell are blown (programmed). In addition, antifuses are programmed such that an external device accessing the contents of address 112 will access the redundant memory cell and not the primary memory cell. If the addresses are not the same, the primary address is accessed.

Figure 1B:
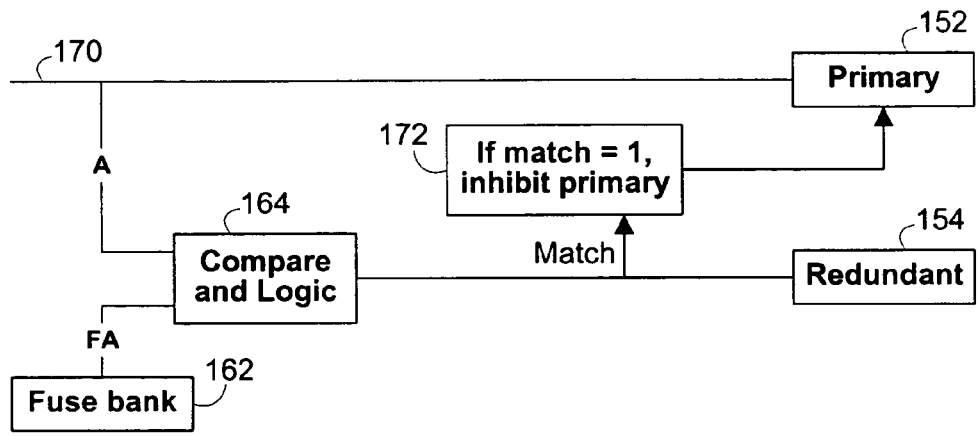
FIG. 1B illustrates primary and redundant memory cells selectively coupled to an address bus.

FIG. 1B illustrates memory redundancy. Primary memory cell 152 has a corresponding redundant memory cell 154. If primary memory cell 152 is damaged, the memory device can be programmed to access redundant memory cell 154 instead. This is done by first programming the address of the damaged/defective cell into a fuse bank 162. When an access to primary cell 152 is attempted, the address is compared with the programmed address in fuse bank 162 by compare and logic circuitry 164. If they are the same, match circuit 172 produces a signal to ensure that the redundant memory cell 154 is accessed and not the defective primary memory cell 152.

Figure 1C:
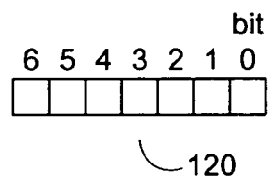
FIG. 1C represents physical storage for storing a seven-bit address.

Address banks store addresses. In order to access the content of memory cells, memory cell addresses should be stored in the memory device. If a memory device is to store sixteen addresses, the memory device should have sixteen address banks. Using a conventional approach, address banks may be represented schematically as address bank 120 of FIG. 1C. As shown, address bank 120 has seven bit positions to store a seven-bit address. To store sixteen seven-bit addresses, sixteen address banks 120 are required.

Figure 2A:
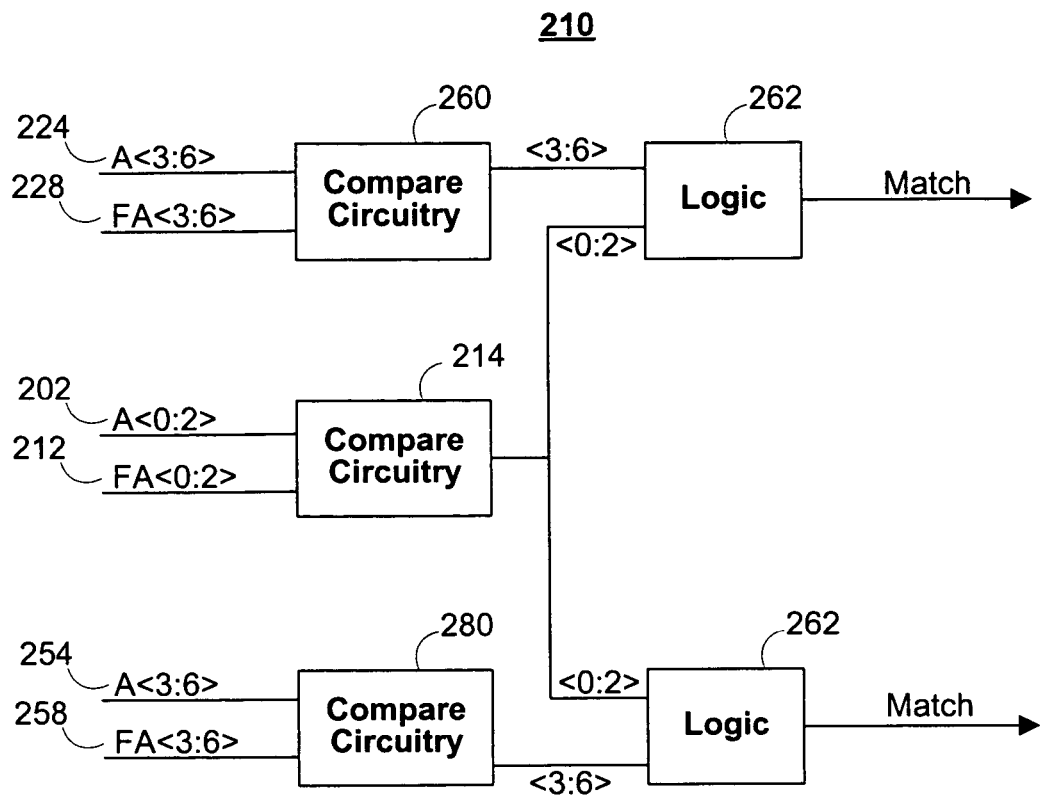
FIG. 2A illustrates hardware components for identifying two seven-bit addresses of damaged memory cells according to one embodiment of the invention.

FIG. 2A illustrates circuitry 210 for two addresses that share three LSBs in accordance with the invention. This configuration provides the same redundancy as two conventional circuits 110, but with less fuses and hardware components. The three shared LSBs form address portion 202 and are denoted "<0:2>," indicating bits in the 0, 1, and 2 positions. Each bit of address portion 202 is individually compared by comparator circuitry 214 to an address portion 212 of a fuse bank (denoted "FA<0:2>"). The output of comparator circuitry 214 is provided to logic blocks 262 and 282. The fuse banks, compare circuits, and logic circuits of FIG. 2A function in the same manner as the corresponding components in FIG. 1A.

The remaining portions of each of the two seven-bit addresses are address portion 224 ("A<3:6>") and address portion 254 ("A<3:6>"). Address portions 224 and 254 are compared to address portions 228 and 258 (both denoted "FA<3:6>") of respective fuse banks. The output of comparator circuitry 260 is provided to logic block 262 and the output of comparator circuitry 280 is provided to logic block 282.

At logic block 262, the comparison results of the three least significant bits of the first address (i.e., address portion 202) and the four most significant bits of the first address (i.e., address portion 224) are combined to check for a match. Similarly, at logic block 282, the comparison results of the three least significant bits of the second address (i.e., address portion 202) and the four most significant bits of the second address (i.e., address portion 254) are combined to check for a match.

As described above, conventionally providing redundancy for two seven-bit addresses requires seven fuses and seven compare circuits (XNOR gates) for each address. Thus, a total of fourteen fuses and fourteen compare circuits are required. In contrast, by sharing three LSBs (e.g., as shown in FIG. 2A), only eleven fuses and eleven compare circuits are required (three fuses and three compare circuits for the shared portion of the addresses and four fuses and four compare circuits each for the non-shared portions of the addresses). Thus, two addresses that share three LSBs can be stored using less fuses and hardware components than conventional approaches.

Figure 2B:
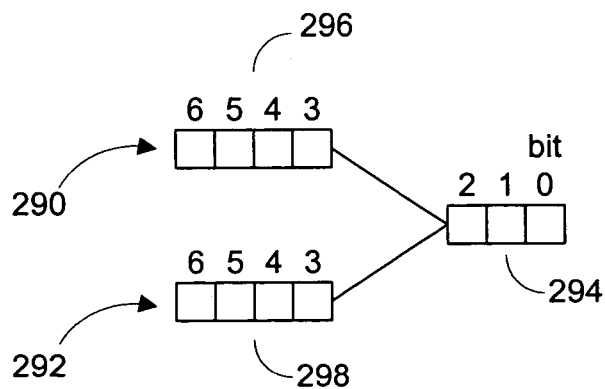
FIG. 2B represents physical storage for storing two seven-bit addresses according to the same embodiment of the invention as in FIG. 2A.

The two seven-bit addresses that share three LSBs may be stored as represented schematically in FIG. 2B. Address bank 290 and address bank 292 share three LSBs. The three shared LSBs are stored in shared address bank portion 294. The four MSBs of each address are stored in address bank portions 296 and 298, respectively. Thus, address bank 290 comprises bank portion 296 and shared bank portion 294. Address bank 292 comprises bank portion 298 and shared bank portion 294. Thus, even in this simple case, the sharing of three LSBs among two address banks reduces the address bits to be stored by three.

Figure 3:
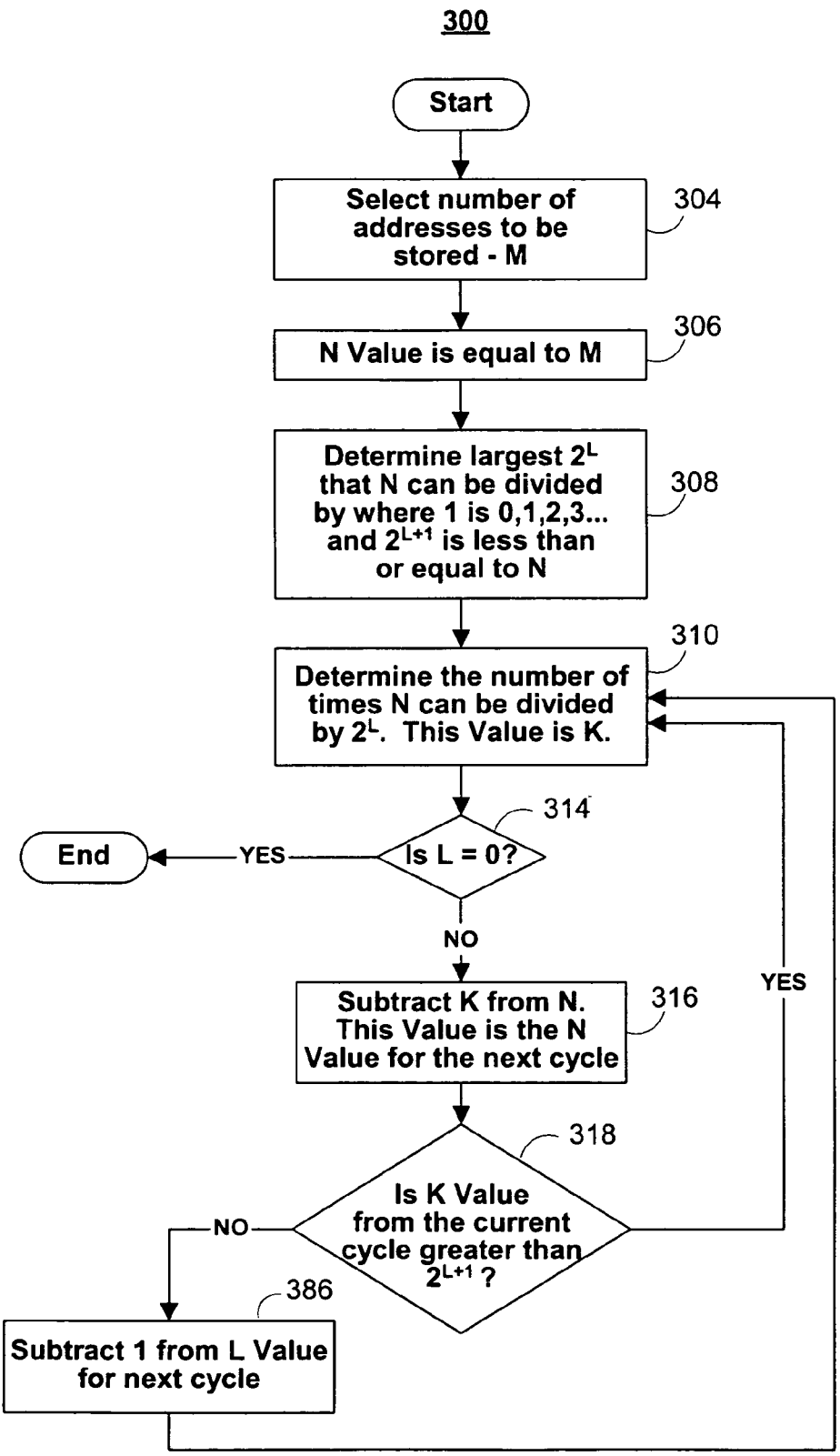
FIG. 3 is a flow chart of a first algorithm according to the invention.

FIG. 3 shows a flow chart of a first algorithm 300 in accordance with the invention. Algorithm 300 determines the number of LSBs that can be shared among banks and the number of banks that can share those LSBs. At 304, the number of memory cell addresses M to be stored is selected. A first value N is set equal to M at 306. The value N changes for each cycle of the algorithm.

At 308, a value L is determined. L can be zero or a positive whole number and is the largest power of 2 that N can be divided by such that N and 2 to the power of L are different by a factor of 2. In other words, the largest $2^L$ (where L is 0, 1, 2, 3 . . . ) that N can be divided by such that $2^{L+1}$ is less than or equal to N is determined. For example, if N is 16, then L is 3.

At 310, the number of times that N can be divided by $2^L$ is determined. This value is K. Mathematically, K can be expressed as $N/2^L$. K is the number of banks that share L least significant bits.

At 314, if L is zero, the algorithm ends. If L is a positive whole number, the algorithm continues to 316.

At 316, K is subtracted from N. This new value of N will be used in the next cycle of the algorithm.

At 318, if K is greater than $2^{L+1}$, the algorithm returns to 310 with L-remaining at its current value. If K is not greater than $2^{L+1}$, the algorithm continues to 386, where L is decreased by 1. The algorithm then returns to 310.

Algorithm 300 continues until L is zero.

For each cycle of the algorithm, a set of L and K values is determined. The L or K values may be the same for consecutive cycles. Each set indicates how many banks (K) share how many LSBs (L). For example, if after a first cycle, K is 3 and L is 2, three banks can share two LSBs. If after a second cycle, K is 5 and L is 1, an additional five banks share one LSB.

Figure 4:
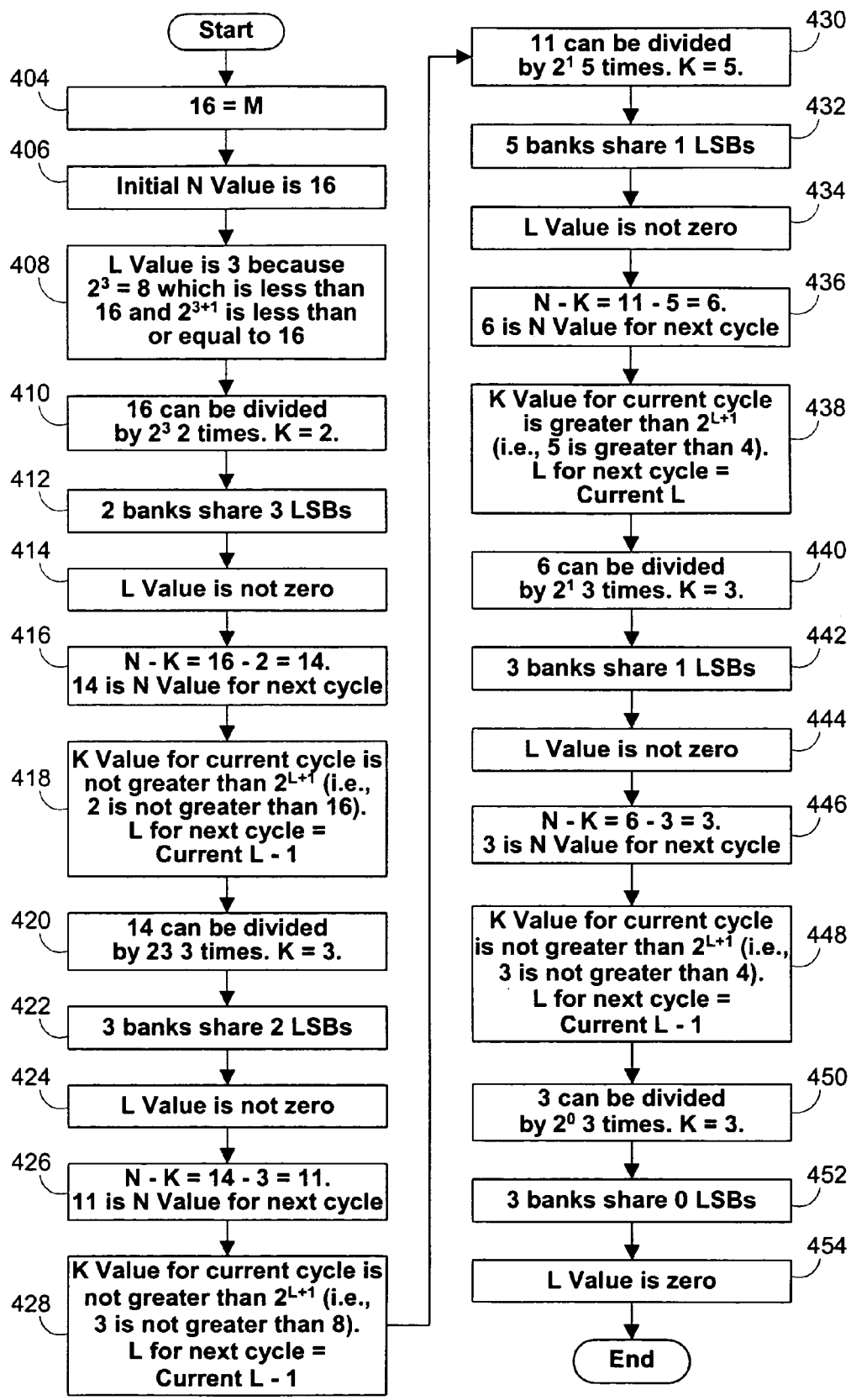
FIG. 4 is a flow chart illustrating an application of the algorithm of FIG. 3.

FIG. 4 illustrates an example of this algorithm. The number of addresses to be stored is 16. Therefore, M is 16 (at 404) and N is initially set to 16 (at 406). L is initially determined to be 3 (at 408), because 23 is equal to 8 which is less than 16 (M) and $2^{3+1}$ is less than or equal to 16.

At 410, the number of times that N (16) can be divided by $2^L$ (8) is determined. The result is 2, which is K.

Thus, after a first cycle of algorithm 300, 2 (K) banks share 3 (L) LSBs (see 412).

At 414, the value of L is checked. Because L is not zero, the algorithm continues.

At 416 and 418, the algorithm determines the N and L values for the next cycle of the algorithm. At 416, the current K (2) is subtracted from the current N (16) to determine the N for the next cycle, which is 14 (i.e., 16−14=2). At 418, the algorithm determines whether the L value for the next cycle will be the current L value or one less than the current L value. This determination is based on whether the current K is greater than $2^{L+1}$. In this case, K is not greater than $2^{L+1}$, because 2 is not greater than 16 (i.e., $2^{3+1}$). The L value for the next cycle is thus L−1 (L=3−1) which is 2.

With N equal to 14 and L equal to 2, K is determined at 420. Here, K is 3 because $14/2^2$ (i.e., $N/2^L$) is 3.

Thus, after a second cycle, 3 (K) additional banks share 2 (L) LSBs (see 422).

Because L for this cycle is again not zero (which is checked at 424), the algorithm continues to 426, where N for the next cycle is determined. The next N will be the current N less K, which is 11.

The L for the next cycle is determined at 428. Because K for the current cycle is not greater than $2^{L+1}$ (i.e., 3 is not greater than $2^{2+1}$), L for the next cycle will be one less than L for the current cycle. That is, L for the next cycle is 1 (i.e., 2−1).

At 430, the next K is determined. For this cycle, N is 11 (determined at 426) and L is 1 (determined at 428). K for this cycle is therefore 5 because $11/2^1$ is 5. Thus, 5 banks share 1 LSB (432).

Again, because L is still not zero, the algorithm continues with another cycle.

At 436, N for the next cycle is determined (current N less the current K). Here, the new N is 6 (i.e., 11−5).

At 438, L for the next cycle remains constant (i.e., 1 will not be subtracted from the L value) because K is greater than $2^{L+1}$ (i.e., 5 is greater than $2^{1+1}$).

At 440, K for the next cycle is 3 because N (6) can be divided by $2^L$ (i.e., $2^1=2$) three times.

Thus, 3 (K) more banks share 1 (L) LSB (see 442). As was the case with the previous cycles, L in this cycle is also not zero (checked at 444). Therefore, N and L for the next cycle are determined.

At 446, N for the next cycle is 3 (i.e., current N—current K=6−3=3).

At 448, L for the next cycle is zero because K for the current cycle is not greater than $2^{L+1}$. Thus, L−1 equals zero.

At 450, K is 3 (i.e., $N/2^L=3/2^0=3$) (450). Thus, three (K) banks share zero (L) LSBs (see 452). Because L in this cycle is zero, the algorithm ends.

In sum, this algorithm determined that to store 16 addresses, two banks can share three LSBs, an additional three banks can share two LSBs, five more banks can share one LSB, three more banks can share one other LSB, and three other banks do not share any LSBs.

Figure 5:
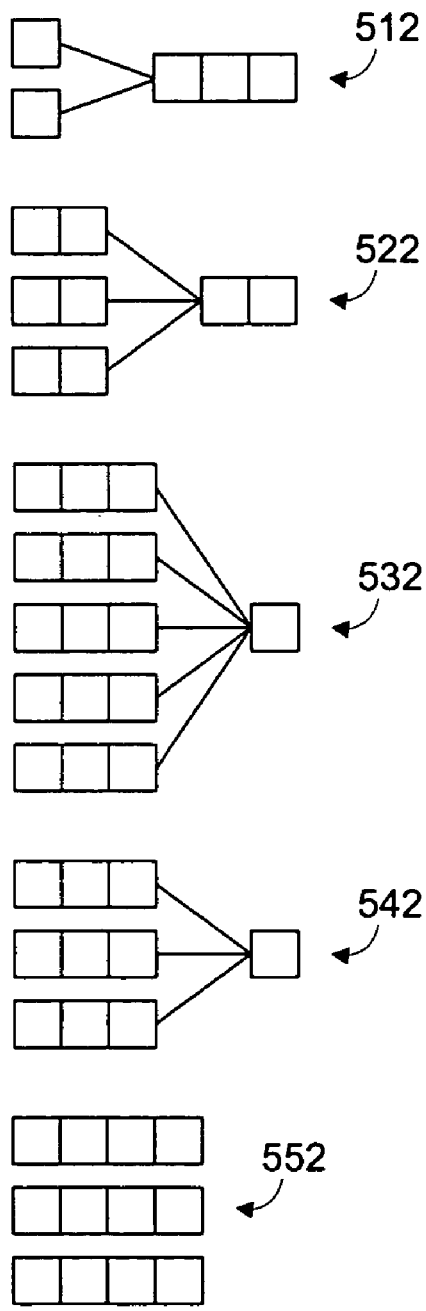
FIG. 5 represents physical storage for the application of FIG. 4 according to the invention.

FIG. 5 shows a redundancy structure 500 configured in accordance with this determination. Two banks 512 share three LSBs, three banks 522 share two LSBs, five banks 532 share one LSB, an additional three banks 542 share another LSB, and three residual banks 552 do not share any bits. A total of 13 memory bank bit locations are saved.

Figure 8B:
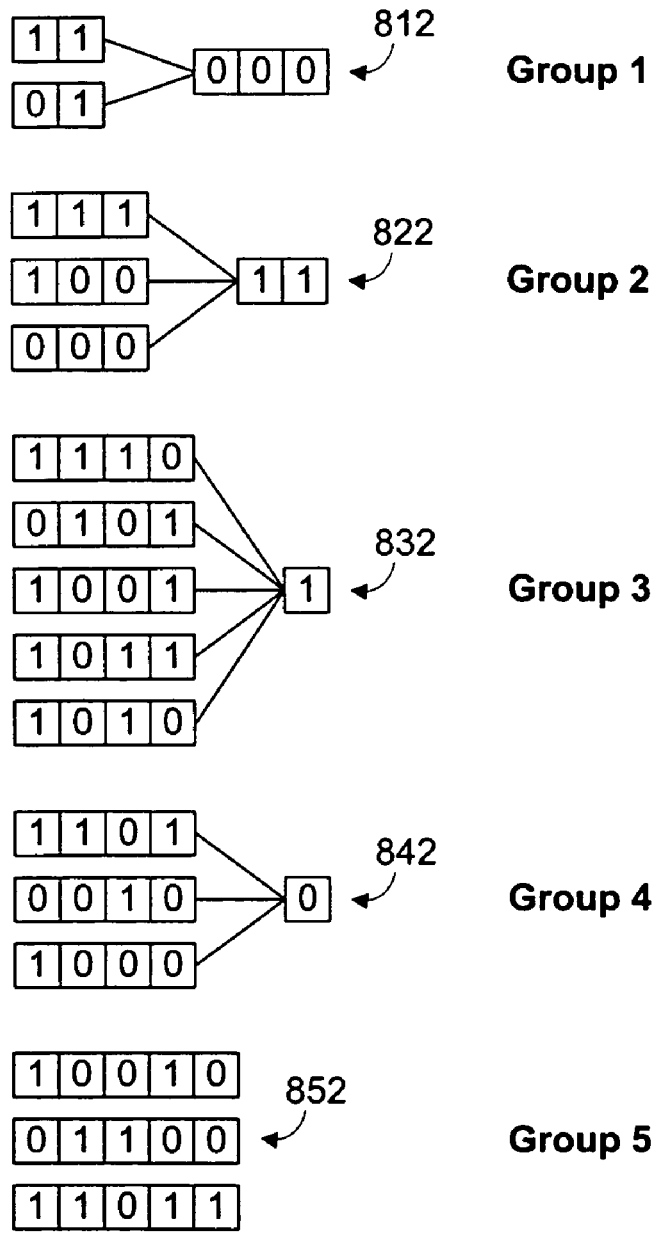
FIG. 8B represents physical storage for the 16 random addresses of FIG. 8A.

Because M was selected as 16, algorithm 300 produces results for the storage of 16 addresses on redundancy structure 500. Notably, 16 is 2 to the fourth power and therefore the redundancy structure can accommodate every possible four-bit address. If memory addresses longer than four bits are to be stored in redundancy structure 500, the additional bits are placed in front of each bank as MSBs. For example, if 16 five-bit addresses (as opposed to four-bit addresses) are to be stored in redundancy structure 500, an additional physical memory location is placed in front of the banks as an MSB (FIGS. 7B and 8B show how a random pattern of 16 five-bit addresses are stored in accordance with the results of algorithm 300).

If M were in the range of 17–32 addresses, each bank of the corresponding redundancy structure would have at least five physical memory locations to store at least five bits. Similarly, if M were in the range of 33–64 addresses, each bank of the corresponding redundancy structure would have at least six physical memory locations to store at least six bits, and so on.

FIGS. 6A–6E show in tabular form the cycle-by-cycle results of algorithm 300 for the example of FIG. 4. The results of the first cycle are shown in FIG. 6A. For M addresses set at 16, N is initially 16, L for the first cycle is 3, and K is 2. Because L is not zero, N and L for the next cycle are determined. FIGS. 6B–6E each show the results of the next and subsequent cycles.

A random pattern 760 of 16 five-bit addresses is shown in FIG. 7A. Because M is 16, the results of algorithm 300 are the same (thirteen memory bank bit locations saved) even though these addresses are five bits long. As previously described, an additional physical memory location is placed in front of the banks as a most significant bit (MSB). Redundancy structure 700 is identical to redundancy structure 500 except that redundancy structure 700 has five physical memory locations for each bank instead of four.

Next to each address in pattern 760 is a group number 762. The group number indicates the set of banks (i.e., 712, 722, 732, 742, or 752) to which the addresses are assigned. The assignment of the addresses to the groups is somewhat flexible in that there are alternative arrangements for how this pattern of addresses could be stored. For example, addresses 11111 and 01111 from bank 732 can alternatively be stored in bank 712, with addresses 00000 and 01000 from bank 712 alternatively stored in bank 752 in place of addresses 00111 and 01011. Addresses 00111 and 01011 can then alternatively be stored in banks 732 with their LSB being shared along with the LSB of addresses 10011, 11001, and 00001.

FIG. 8A shows another random pattern 860 of sixteen five-bit addresses that can be stored in redundancy structure 800 of FIG. 8B, which is constructed identically to redundancy structure 700. The group numbers 862 associated with each address of pattern 860 indicates the bank (i.e., banks 812, 822, 832, 842, or 852) in which each address is stored. As was the case with the addresses of pattern 760 and redundancy structure 700, the assignment of the addresses of pattern 860 to the banks of redundancy structure 800 is somewhat flexible.

Although patterns 760 and 860 are respectively stored in redundancy structures 700 and 800 as shown, there may be circumstances where it is preferable to store addresses that only have, for example, O's as LSBs. Such circumstances may involve faster switching times and physical location of particular address banks.

Figure 9A:
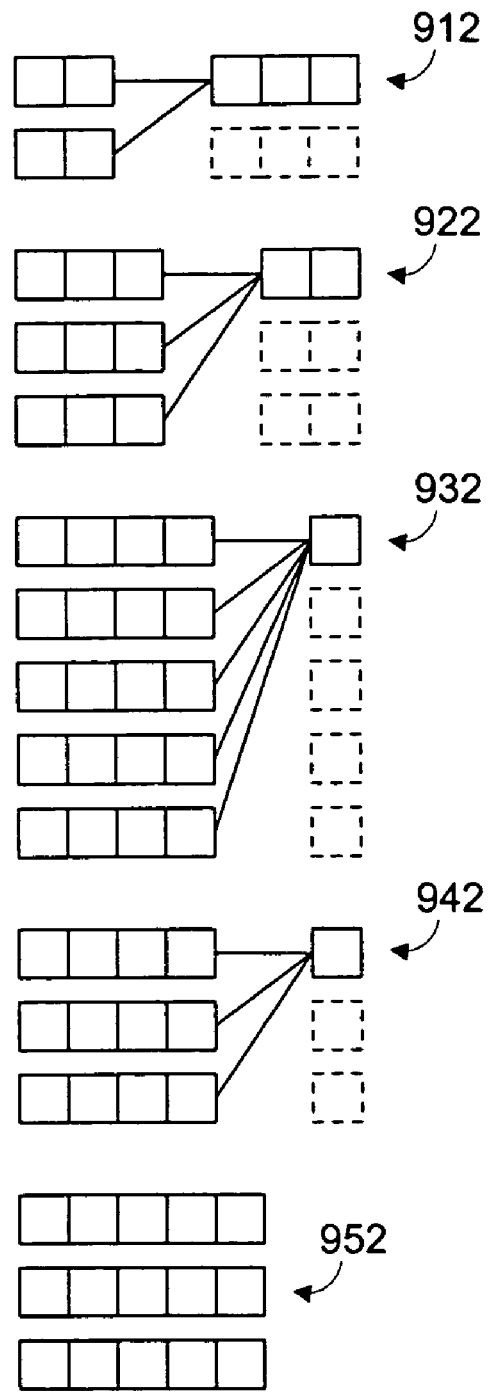
FIG. 9A represents physical storage constructed according to the invention with the number of bits saved shown in phantom.

FIG. 9A shows the redundancy structures of FIGS. 7 and 8, but with the saved physical memory locations in phantom. The phantom physical memory locations (i.e., 912, 922, 932, and 942) are those physical memory locations that would have been-required had none of the LSBs been shared. The number of saved physical memory locations can be determined mathematically as follows.

FIG. 9B shows the calculations for determining N, K, and L for each cycle of the first algorithm. Alongside those calculations is a column indicating the number of physical memory locations saved each cycle. The number saved is K minus one multiplied by L. The total number of physical memory locations saved is the sum of the saved locations for each cycle, which for this example is 13.

Figure 10:
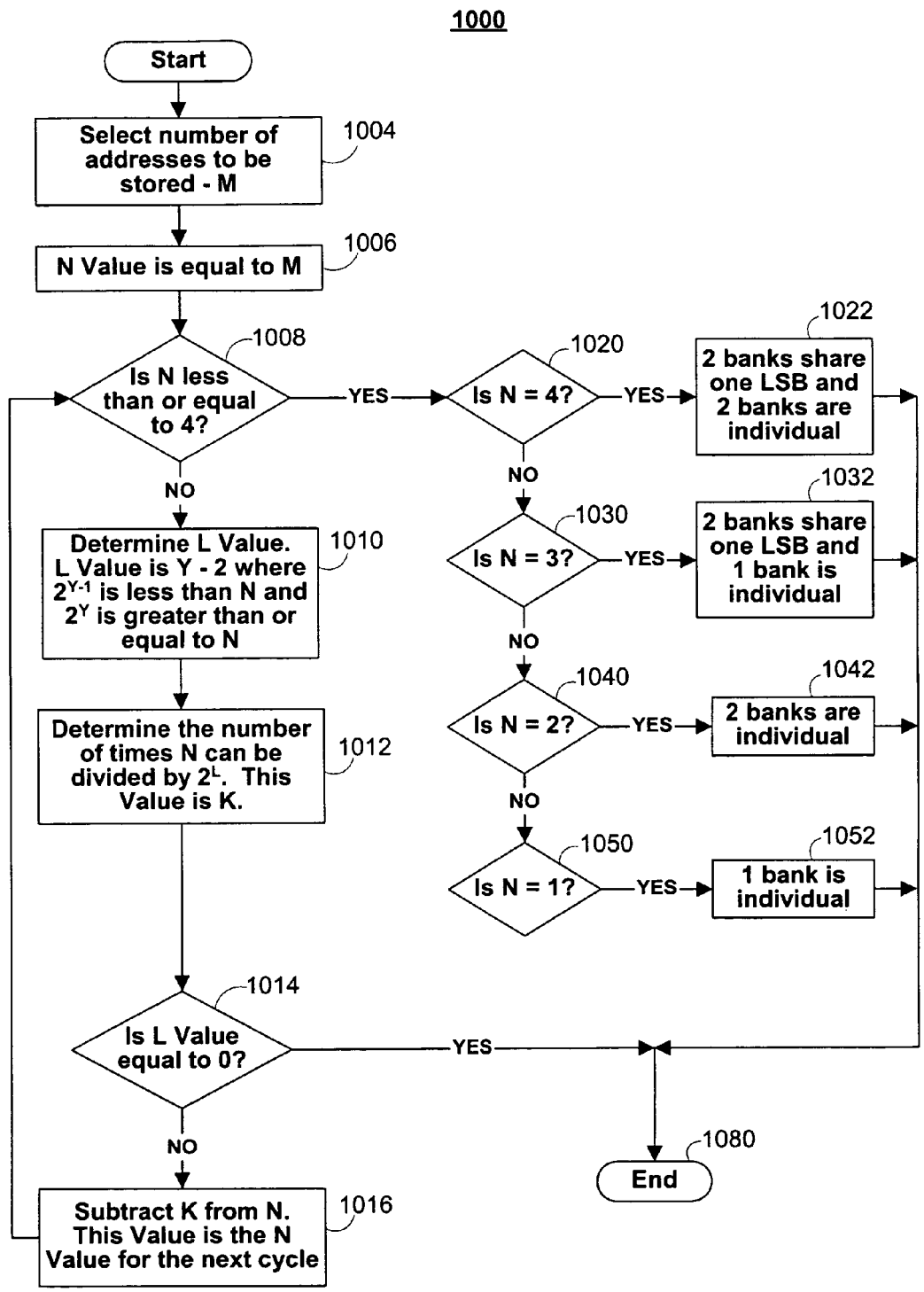
FIG. 10 is a flow chart of a second algorithm according to the invention.

FIG. 10 shows a flow chart of a second algorithm 1000 in accordance with the invention. Algorithm 1000 determines the number of LSBs that can be shared among banks and the number of banks that can share those LSBs.

At 1004, the number of M addresses to be stored is selected where M is greater than or equal to 4.

A first value N is set equal to M at 1006. The value N changes for each cycle of algorithm 1000.

At 1008, the value of N is checked. If N is less than or equal to 4, algorithm 1000 continues at 1020. If N is not less than or equal to 4, algorithm 1000 continues at 1010. At 1010, L is determined. L for algorithm 1000 is Y−2 where $2^{Y-1}$ is less than N and $2^Y$ is greater than or equal to N where Y is a positive integer.

At 1012, the number of times N can be divided by $2^L$ is determined. This value is K. Mathematically, K can be expressed as $N/2^L$. K is the number of banks that share L least significant bits.

At 1014, the L value is checked. If L is equal to zero, algorithm 1000 ends at 1080. If L is not equal to zero, algorithm 1000 continues at 1016.

At 1016, K is subtracted from N. The result will be N for the next cycle. After this determination, algorithm 1000 returns to 1008.

As stated previously, if N is less than or equal to 4 at 1008, algorithm 1000 continues at 1020.

If N is 4 at 1020, algorithm 1000 continues at 1022 where algorithm 1000 determines that two banks share one LSB and two banks are residual (sharing no fuses with any other bank). After this determination, algorithm 1000 ends.

If N is not 4 at 1020, algorithm 1000 continues at 1030.

At 1030, algorithm 1000 determines whether N is 3. If N is 3, algorithm 1000 continues at 1032 where algorithm 1000 determines that two banks share one LSB and one bank is residual. After this determination, algorithm 1000 ends.

If N is not 3 at 1030, algorithm 1000 continues at 1040.

At 1040, algorithm 1000 determines whether N is 2. If N is 2, algorithm 1000 continues at 1042 where algorithm 1000 determines that two banks are residual. After this determination, algorithm 1000 ends.

If N is not 2 at 1040, algorithm 1000 continues at 1052.

At 1052, algorithm 1000 determines that one bank is residual. After this determination, algorithm 1000 ends.

Algorithm 1000 produces a set of L and K values for N greater than 4. The L values and corresponding K values along with the determinations at 1022, 1032, 1042, and 1052 are used to create a redundancy structure. For every K and L, K address banks share L LSBs.

Figure 11:
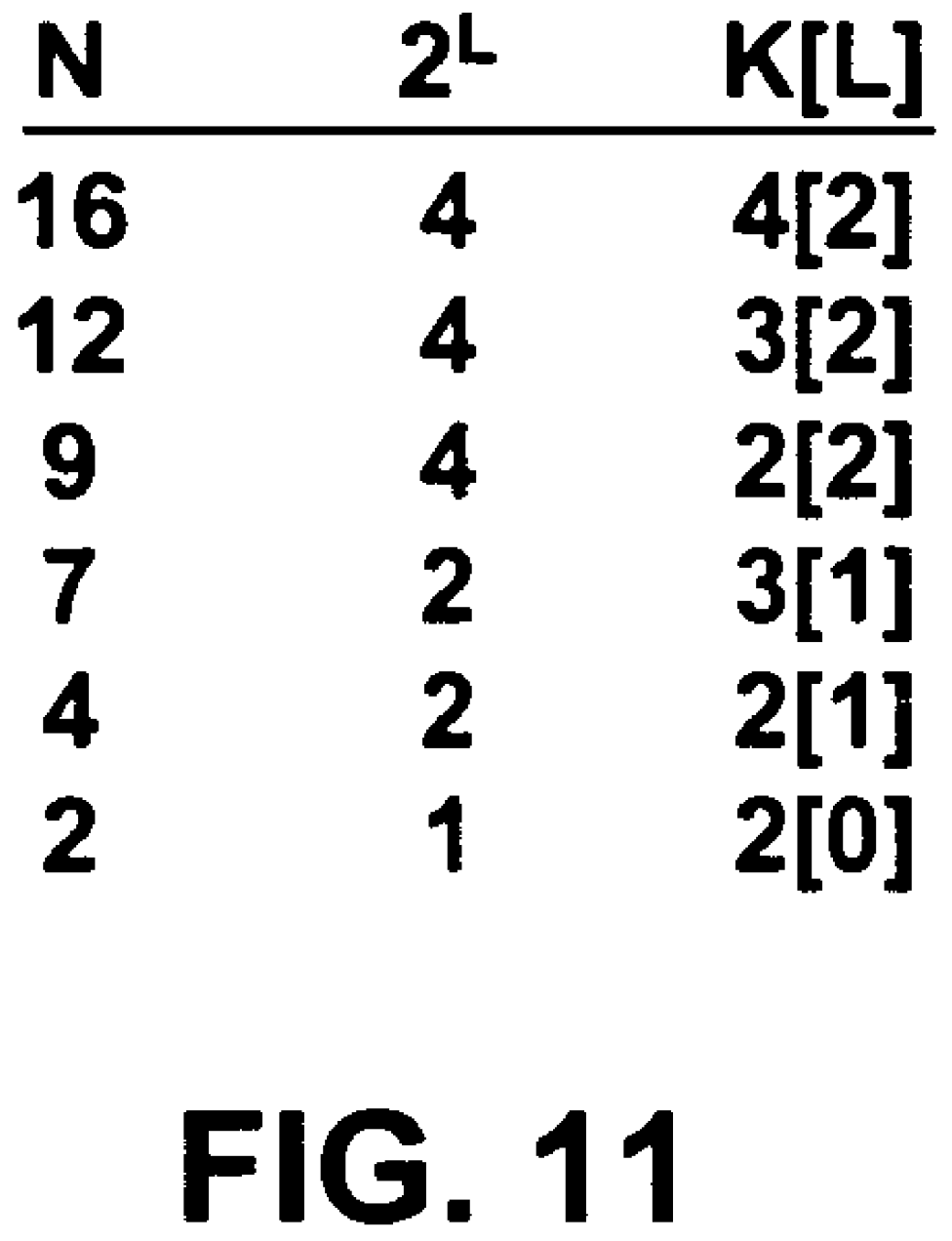

FIG. 11 shows the cycle-by-cycle results of algorithm 1000 for storing 16(M) addresses in a redundant structure. After six cycles, algorithm 1000 determined that four banks share two LSBs (cycle one), three more banks share two LSBs (cycle two), another two banks share two LSBs (cycle three), three more banks share one LSB (cycle four), two other banks share one LSB (cycle five), and two residual banks share no LSBs (cycle six).

Figure 12:
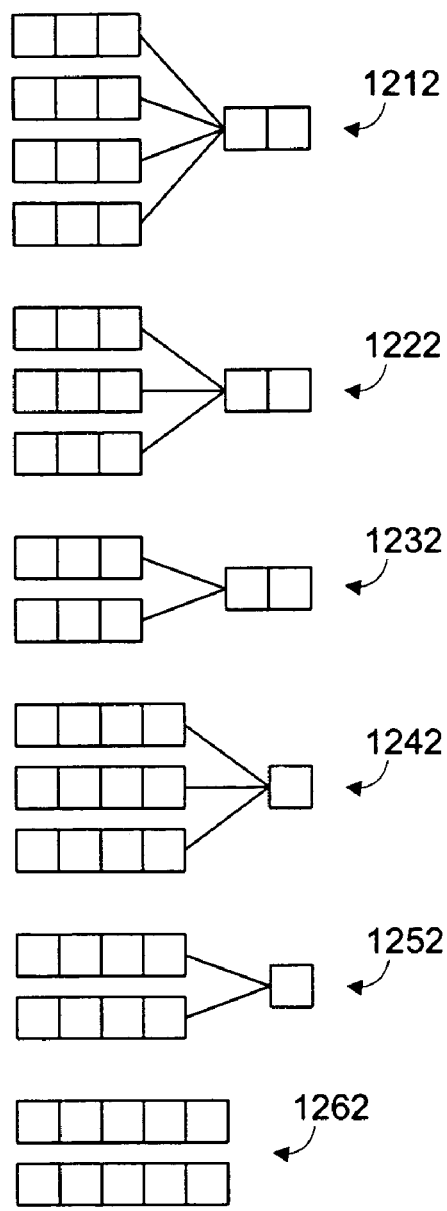
FIG. 12 represents physical storage for the application of FIG. 11 according to the invention.

The redundancy structure that corresponds to the results of algorithm 1000 for 16 addresses is shown in FIG. 12. Redundancy structure 1200 has four banks 1212 that share two LSBs, three banks 1222 that share two LSBS, an additional two banks 1232 that share two LSBs, three banks 1242 that share one LSB, an additional two banks 1252 that share one LSB, and two residual banks 1262 that share no LSBs. A total of 15 memory bank bit locations are saved.

A third non-trial and error technique for reducing circuit components on memory dies, referred to as the binary approach, will now be described. For binary numbers greater than $2^N$, the numbers after 2N show a change in the MSB, but no change in the pattern of LSBs, which repeat. This property of binary numbers lends itself to sharing LSBs—and to eliminating fuses and hardware corresponding to the saved bits.

For example, numbers 0, 1, 2, and 3 are represented in binary as 000, 001, 010, and 011. Numbers 4, 5, 6, and 7 are represented in binary as 100, 101, 110, and 111. As shown, the two LSBs in the numbers 0–7 (represented in binary form) repeat themselves—the two LSBs in the number 0 are identical to the two LSBs in the number 4, the two LSBs in the number 1 are identical to the two LSBs in the number 5, and so on.

Figure 13:
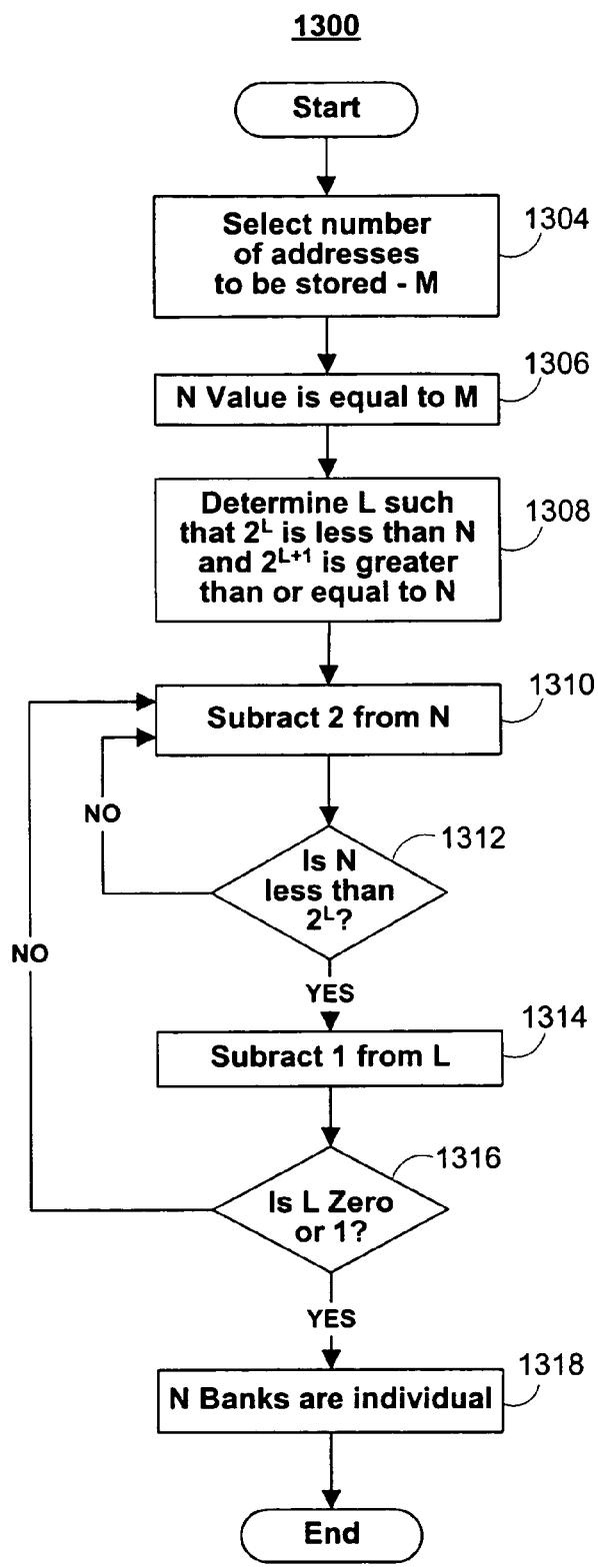
FIG. 13 is a flow chart of a third algorithm according to the invention.

FIG. 13 shows a flow chart of the third technique, algorithm 1300, in accordance with the invention. Algorithm 1300 also determines the number of LSBs that can be shared among banks and the number of banks that can share those LSBs.

At 1304, the number of M addresses to be stored is selected.

A first value N is set equal to M at 1306. The value N changes for each cycle of the algorithm.

At 1308, L is determined. L for this algorithm is such that $2^L$ is less than N and $2^{L+1}$ is greater than or equal to N.

At 1310, 2 is subtracted from N.

At 1312, the algorithm determines whether N is less than $2^L$. If N is not less than or equal to $2^L$, algorithm 1300 returns to 1310. If N is less than or equal to $2^L$, algorithm 1300 continues at 1314.

At 1314, 1 is subtracted from L.

The algorithm continues at 1316 where algorithm 1300 determines whether L is zero or one. If L is not zero or one, algorithm 1300 returns to 1310. If L is zero or one, algorithm 1300 continues at 1318.

At 1318, algorithm 1300 determines that there will be N banks that do not share any LSBs with any other bank. Algorithm 1300 then ends.

Based on algorithm 1300, a redundant structure can be constructed. For each cycle of algorithm 1300, a value L is determined for each N. For each cycle, if L is greater than one, two is subtracted from N. Therefore, two banks share L bits where L is the value determined at 1308 or the result of a subtraction at 1314. If L is zero or one, however, there will be N residual address banks that do not share any LSBs.

For example, if N is 9 for a cycle of algorithm 1300, algorithm 1300 determines that there will be two address banks that share 3 LSBS. If N were 1, algorithm 1300 determines that there will be one address bank that does not share any LSBS.

FIG. 14 shows the cycle-by-cycle results of algorithm 1300 for storing 19(M) addresses in a redundancy structure. Algorithm 1300 determined that two banks share four LSBS, another two banks share four LSBS, four pairs of banks share three LSBs, two pairs of banks share two LSBs, one pair of banks share one LSB, and there is one residual bank.

Figure 15:
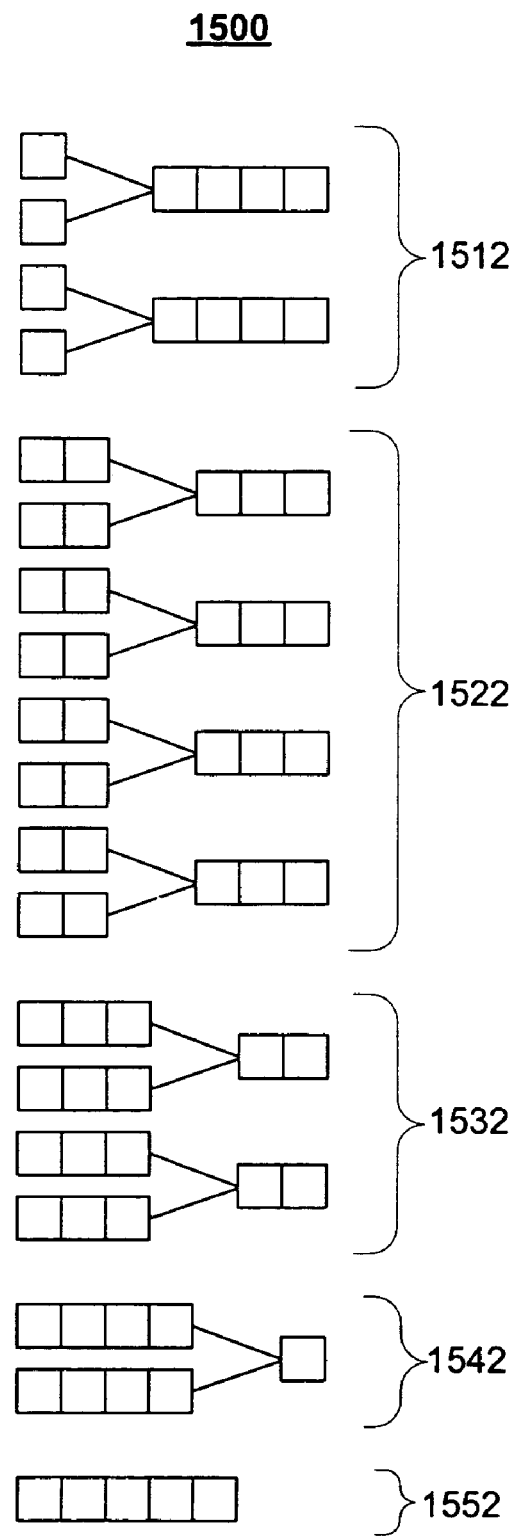
FIG. 15 represents physical storage for storing 19 addresses based on the third algorithm.

The redundancy structure that corresponds to the results of algorithm 1300 for 19 addresses is shown in FIG. 15. Redundancy structure 1500 has two pairs of banks 1512 that share four LSBs each, four pairs of banks 1522 that share three LSBs each, two pairs of banks 1532 that share two LSBs each, one pair of banks 1542 that share one LSB, and one residual bank 1552 that shares no LSB with any other bank. Compared to conventional memory structures, a total of 25 memory bank bit locations are saved.

Figure 16:
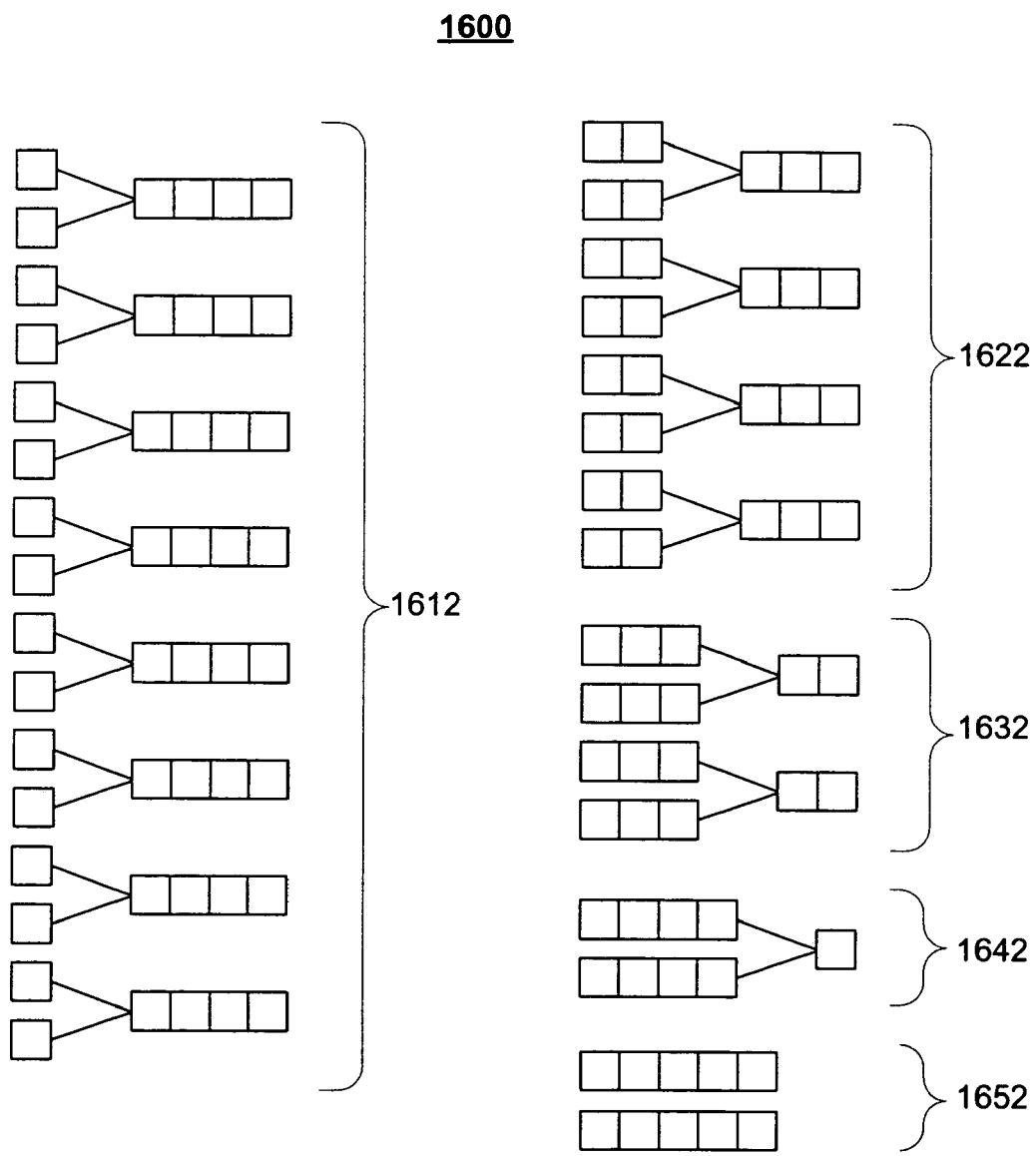
FIG. 16 represents physical storage for storing 32 addresses based on the third algorithm.

The design of redundancy structure 1500 can be extrapolated to store any number of addresses. For example, if thirty-two addresses are to be stored, redundancy structure 1600 (FIG. 16) can be constructed. As shown, redundancy structure 1600 has 16 banks 1612 that share four LSBs, 8 banks 1622 that share three LSBs, 4 banks 1632 that share two LSBs, 2 banks 1642 that share one LSB, and 2 residual banks 1652. Redundancy structure 1600 saves 49 physical memory locations over a conventional redundant structure for storing 32 addresses.

Figure 17:
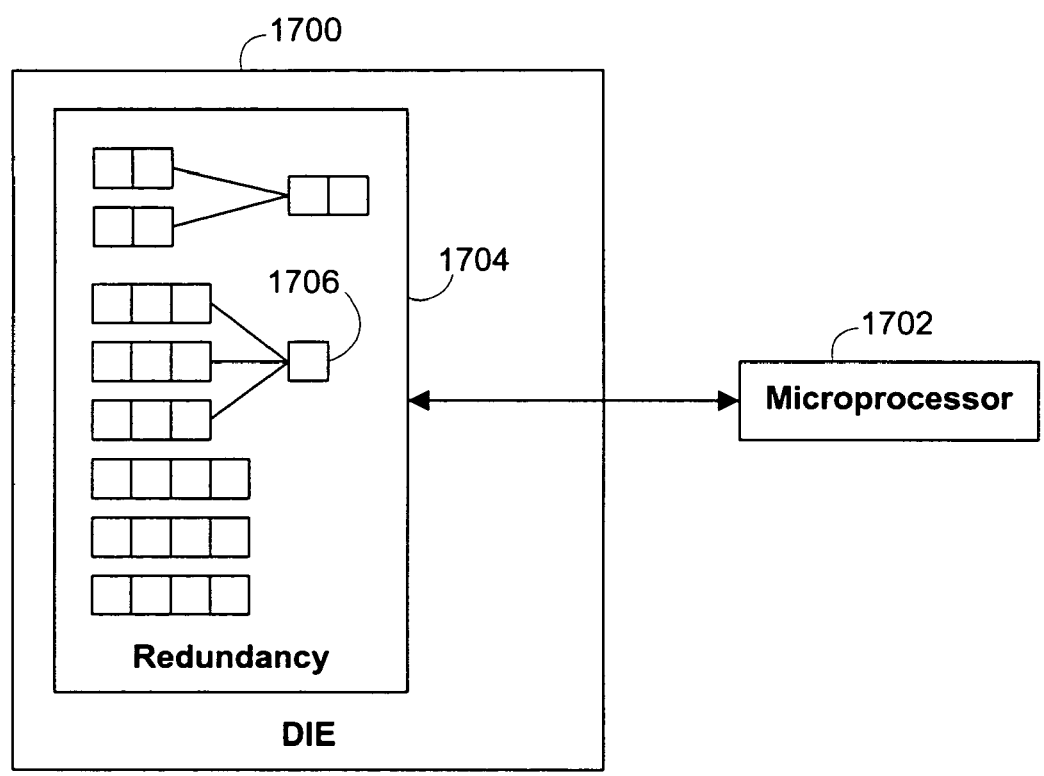
FIG. 17 illustrates a memory device coupled to an external device.

FIG. 17 illustrates a memory device 1704 implemented on a die 1700. Die 1700 may include other integrated circuit devices, including other memory devices. Memory device 1704 stores addresses and data, and may be part of a larger memory system. A redundancy structure 1706 may be constructed within memory device 1704. Redundancy structure 1706 is designed in accordance with either algorithm 300, 1000, or 1300. Redundancy structure 1706 can be expanded to store as many addresses as desired. One or more redundancy structures 1706 may be constructed within one or more memory devices 1704 of die 1700.

Figure 18:
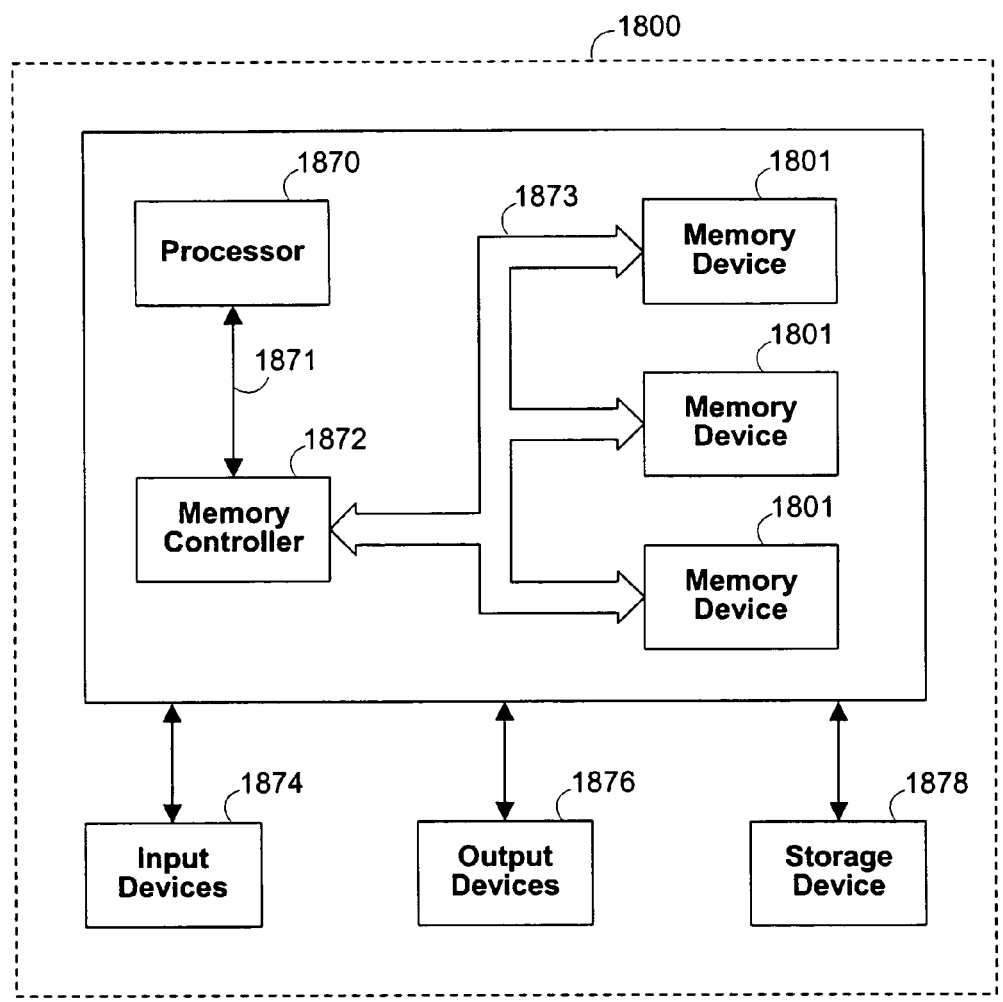
FIG. 18 is an illustrative block diagram of a system that incorporates the invention.

FIG. 18 shows a system that incorporates the invention. System 1800 includes a plurality of memory devices 1801, a processor 1870, a memory controller 1872, input devices 1874, output devices 1876, and optional storage devices 1878. Data and control signals are transferred between processor 1870 and memory controller 1872 via bus 1871. Similarly, data and control signals are transferred between memory controller 1872 and memory devices 1801 via bus 1873. Memory devices 1801 include one or more redundant structures designed with one of the algorithms of the invention. Memory devices 1801 thus have lesser area than conventional memory devices of identical capacity. Input devices 1874 can include, for example, a keyboard, a mouse, a touch-pad display screen, or any other appropriate device that allows a user to enter information into system 1800. Output devices 1876 can include, for example, a video display unit, a printer, or any other appropriate device capable of providing output data to a user. Note that input devices 1874 and output devices 1876 can alternatively be a single input/output device. Storage devices 1878 can include, for example, one or more disk or tape drives.

Although the invention has been described primarily in connection with binary number addresses, the invention is not limited to shared storing of binary number addresses or to designing redundancy structures for shared storing of addresses. For example, register space in a CPU may be saved if a numerical sequence of data/control signals has any LSBs in common.

Thus it is seen that algorithms and other non-trial and error techniques, and redundancy structures constructed in accordance with those algorithms and techniques, reduce the amount of space used on a die to store memory addresses, thus increasing memory density. One skilled in the art will appreciate that the invention can be practiced by other than the described embodiments, which are presented for purposes of illustration and not of limitation, and the present invention is limited only by the claims which follow.

We claim:

1. A method of constructing a memory structure for storing addresses, said method comprising:
    receiving an input number that represents the number of memory addresses to be stored in said memory structure;
    processing said input number in cycles via a plurality of mathematical relationships until a variable of one of said mathematical relationships equals a fixed preset value;
    outputting after each said cycle a number of least significant bits and a number of address banks to share said least significant bits; and
    organizing a plurality of physical storage locations to form said number of address banks sharing said number of least significant bits of each said cycle, each said physical storage location operative to store one bit.

2. The method of claim 1 further comprising:
    storing a portion of an address in a first subplurality of said physical storage locations, said first subplurality of said physical storage locations forming a portion of one of said memory banks; and
    storing the remaining portion of said address in a second subplurality of said physical storage locations, said second subplurality of said physical storage locations forming a remaining portion of more than one of said memory banks.

3. The method of claim 1 wherein said fixed preset value is zero.

4. The method of claim 1 wherein said variable represents a number of least significant bits that can be shared by two or more said address banks.

5. An algorithm for constructing a memory structure for storing addresses, said algorithm determining a number of least significant bit physical memory locations that can be shared and for determining a number of address banks that can share said least significant bit physical memory locations, said algorithm comprising:
    means for receiving an input number, said number representing the number of memory addresses to process in said algorithm for shared storing of least significant bits;
    means for processing said input number in cycles until a variable of said algorithm equals a fixed preset value; and
    means for outputting after each said cycle a number of least significant bits and a number of address banks to share said least significant bits.

6. The algorithm of claim 5 wherein each of said means is a respective portion of software code.

* * * * *

UNITED STATES PATENT AND TRADEMARK OFFICE
CERTIFICATE OF CORRECTION

PATENT NO.         : 7,046,560 B2
APPLICATION NO. : 10/932707
DATED              : May 16, 2006
INVENTOR(S)       : Ayyapureddi et al.

It is certified that error appears in the above-identified patent and that said Letters Patent is hereby corrected as shown below:

Column 1, line 31, change "columsn" to --columns--.

Column 1, line 49, change "anti- fuses" to --anti-fuses--.

Column 2, line 56, change "LSBS" to --LSBs--.

Column 2, line 59, change "LSBS" to --LSBs--.

Column 2, line 61, change "16" (bold) to --16-- (not bold).

Column 2, line 65, change "LSBS" to --LSBs--.

Column 3, line 44, change "16" (bold) to --16-- (not bold).

Column 3, line 48, change "16" (bold) to --6-- (not bold).

Column 3, line 58, delete "-" after "invention;".

Column 3, line 58, start new paragraph with "FIG. 11".

Column 6, line 28, change "23" to --$2^3$--.

Column 8, line 23, change "O's" to --0's--.

Column 8, line 31, delete "-" after "been".

Column 8, line 51, start new paragraph with "At".

Column 9, line 43, change "2N" to --$2^N$--.

Column 10, line 6, change "1"(bold) to --1-- (not bold).

Column 10, line 23, change "LSBS" to --LSBs--.

Column 10, line 25, change "LSBS" to --LSBs--.

Column 10, line 29, change "LSBS" to --LSBs--.

UNITED STATES PATENT AND TRADEMARK OFFICE
CERTIFICATE OF CORRECTION

PATENT NO. : 7,046,560 B2
APPLICATION NO. : 10/932707
DATED : May 16, 2006
INVENTOR(S) : Ayyapureddi et al.

It is certified that error appears in the above-identified patent and that said Letters Patent is hereby corrected as shown below:

Column 10, line 29, change "LSBS" to --LSBs--.

Signed and Sealed this

Sixteenth Day of January, 2007

JON W. DUDAS
*Director of the United States Patent and Trademark Office*